United States Patent [19]

Tomasi

[11] Patent Number: 4,680,722

[45] Date of Patent: Jul. 14, 1987

[54] ARRANGEMENT FOR DETERMINING THE STARTING INSTANT OF THE LEADING EDGE OF A HIGH-FREQUENCY PULSE

[75] Inventor: Jean-Pierre Tomasi, Les Molieres, France

[73] Assignee: U.S. Philips Corporation, New York, N.Y.

[21] Appl. No.: 700,150

[22] Filed: Feb. 11, 1985

[30] Foreign Application Priority Data

Feb. 15, 1984 [FR] France ............... 84 02284

[51] Int. Cl.$^4$ ........................... H04N 3/14
[52] U.S. Cl. ..................... 364/569; 342/202
[58] Field of Search ........ 364/569, 555, 200 MS File, 364/900 MS File; 328/129, 131, 138; 342/47, 92, 202

[56] References Cited

U.S. PATENT DOCUMENTS

| 4,165,459 | 8/1979 | Curtice | 364/569 X |
| 4,168,526 | 9/1979 | Auer, Jr. et al. | 364/569 |
| 4,395,712 | 7/1983 | O'Hare | 342/47 |
| 4,397,031 | 8/1983 | Weber | 364/569 X |
| 4,468,746 | 8/1984 | Davis | 364/569 |
| 4,518,964 | 5/1985 | Heytel | 342/47 |
| 4,584,656 | 4/1986 | Sakai et al. | 364/569 |

OTHER PUBLICATIONS

Chiarini et al, "A New Technique for the Precision DME of Microwave Landing System," *Alta Frequenza*, Oct. 1982, pp. 242–256.

Primary Examiner—Parshotam S. Lall
Assistant Examiner—H. R. Herndon
Attorney, Agent, or Firm—Robert J. Kraus

[57] ABSTRACT

An arrangement for determining the starting instant $t_o$ of the leading edge of a received high-frequency pulse signal V of the form $$V = A.(t - t_o).\sin 2\pi F t,$$

where
V is the instantaneous voltage,
A is the slope (which is unknown) of the leading edge,
t is the time, and
F is the frequency.

The arrangement includes delay means for delaying the received pulse by a period of time equal to k/2F (where k is an integer) and for thus producing a second pulse signal $V_R$ of the form $$V_R = A.(t - t_o - (k/2F)).\sin 2\pi[F(t - (k/2F))]$$

The pulse signals are applied to calculating means which determines $t_o$ by performing the calculation $$t_o = t - \frac{k(-1)^k V}{2F[(-1)^k V - V_R]}.$$

7 Claims, 7 Drawing Figures

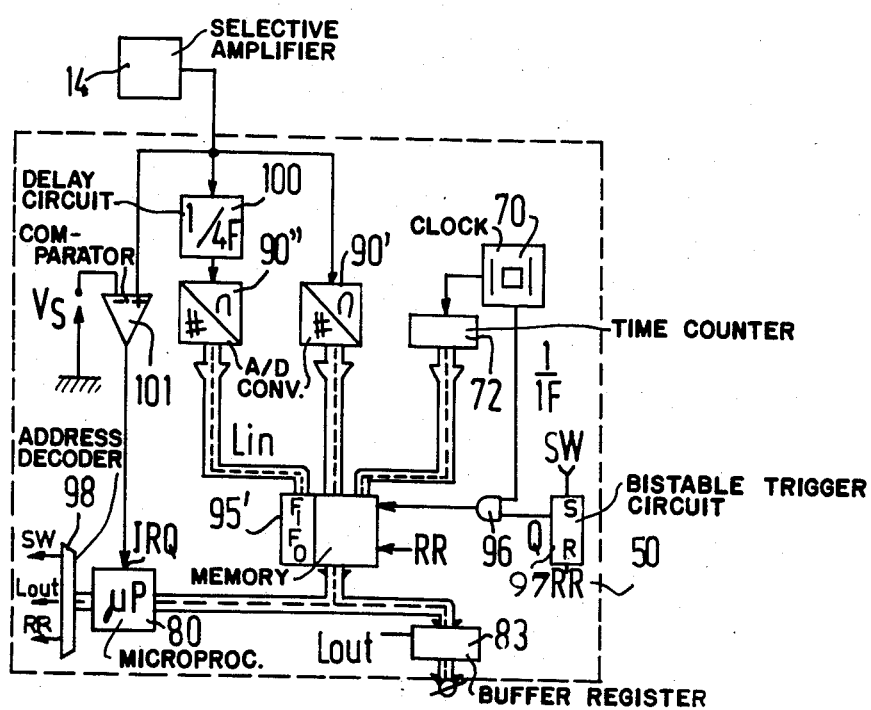
FIG.6
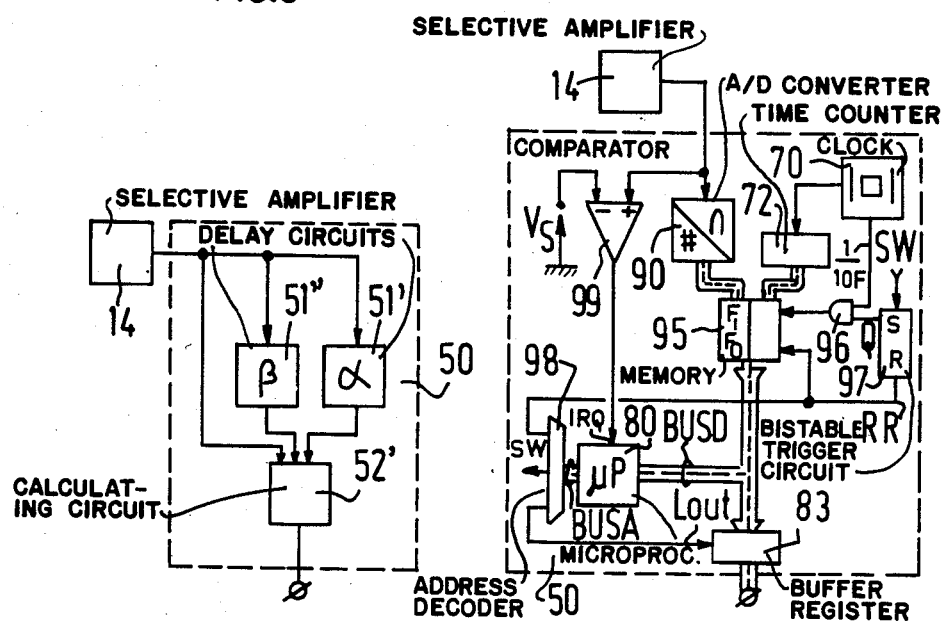
FIG.7
FIG.5

ARRANGEMENT FOR DETERMINING THE STARTING INSTANT OF THE LEADING EDGE OF A HIGH-FREQUENCY PULSE

BACKGROUND OF THE INVENTION

The present invention relates to an arrangement for determining the starting instant of the leading edge of a received high-frequency pulse V of the form:

$$V = A.(t-t_o).\sin 2\pi Ft \qquad (t>t_o)$$

where:
- V is the instantaneous voltage
- A is the slope (which is unknown) of the leading edge
- t is the time
- F is the frequency.

Arrangements of this type can be used with particular advantage in the field of radio navigation, for which use reference is made to the article in the periodical ALTA FREQUENZIA, entitled: "A New Technique for the Precision DME of Microwave Landing System" by CHIARINE et al, published in volume LI No. 5, September-October 1982. In this article mention is made, in paragraph 4, of an arrangement of the type defined in the opening paragraph. To have this arrangement function correctly, the following requirements must be satisfied:

the pulse must be detected in accordance with a linear law so as to respect the linearity of the slope of the leading edge;

and the frequency of the pulse before detection must be high.

Actually, in the intended field of application, the duration of the linear portion of the leading edge does not exceed 300 ns, while the required precision is approximately 30 ns. In order to obtain this precision, the period of the high frequency must be less than 30 ns, that is to say it must have a frequency exceeding 30 MHz. This makes impossible the otherwise advantageous technique of effecting the second frequency change, and consequently passing from the first intermediate frequency (63 MHz) to the customary second frequency (10 MHz).

SUMMARY OF THE INVENTION

The invention has for its object to provide an arrangement for determining the instant at which the leading edge of a high-frequency pulse starts, for which the above requirements do not hold. To that end, the arrangement is characterized in that it comprises delay means for delaying the received pulse by a time equal to k/2F (where k is an integer) and for thus producing a second pulse $V_R$ of the form:

$$V_R = A \cdot \left(t - t_o - \frac{k}{2F}\right) \cdot \sin 2\pi \left[F\left(t - \frac{k}{2F}\right)\right]$$

and a calculating circuit for calculating the instant $t_o$ by effecting the following calculation:

$$t_o = t - \frac{k(-1)^k V}{2F - [(-1)^k V - V_R]}$$

BRIEF DESCRIPTION OF THE DRAWINGS

The following description, given by way of non-limitative example with reference to the accompanying drawing figures will make it better understood how the invention can be put into effect:

FIG. 5 shows a second embodiment of the arrangement according to the invention;

FIG. 6 shows a third embodiment of the arrangement according to the invention;

FIG. 7 shows a circuit diagram of another arrangement according to the invention.

DESCRIPTION OF THE PREFERRED EMBODIMENTS

Figure 1:
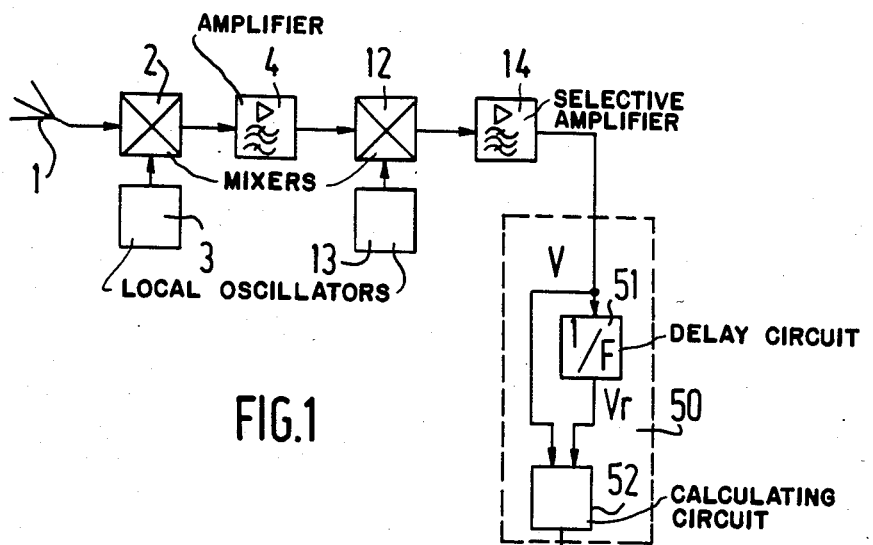
FIG. 1 shows a circuit diagram of an arrangement according to the invention.
Figure 2:
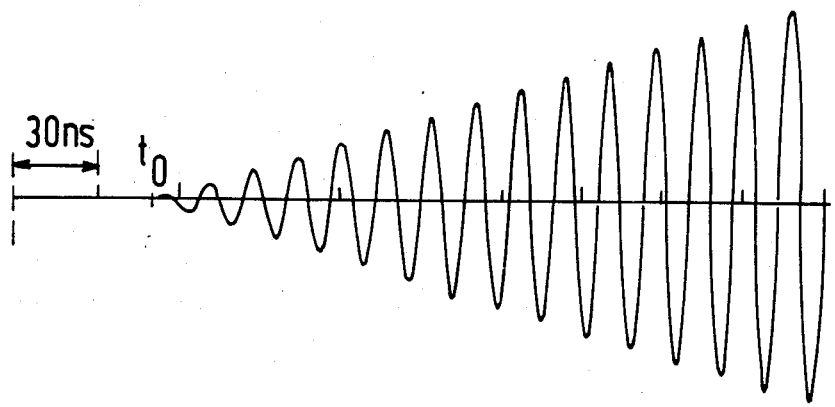
FIGS. 2 and 3 show the shape of the leading edge of the pulse at 63 MHz and at 10 MHz, respectively.
Figure 3:
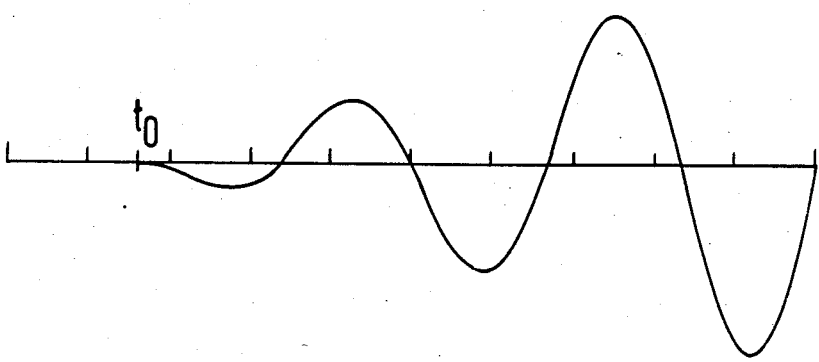

In FIG. 1, reference numeral 1 denotes an aerial which receives the wave whose carrier frequency is of the order of GHz. After a first frequency change obtained by means of a first mixer 2, which cooperates with a first local oscillator 3, an intermediate frequency of 63 MHz is obtained. FIG. 2 shows the shape of the leading edge having a duration of 300 ns of a pulse at the output of the mixer 2. After the pulse has been conveyed through an amplifier 4, a second frequency change of 10 MHz is obtained by means of a second mixer 12, which cooperates with a second local oscillator 13 which is followed by a selective amplifier 14. The shape of the leading edge is shown in FIG. 3.

With the above-described arrangement the instant $t_o$ is determined from the pulse recovered at the end of the first frequency change where the signals to be processed are fast; therefore the invention has for its object to provide an arrangement for which the instant $t_o$ is determined by signals recovered at the end of the second frequency change where the signals to be processed are slower. The leading edge of this pulse may be written as:

$$V = A(t - T_o) \cdot \sin 2\pi Ft \qquad (t > T_o) \quad (1)$$

where
- V is the instantaneous voltage
- A is the slope (which is unknown) of the leading edge
- t is the time and
- F is the frequency (here 10 MHz).

According to the invention, the arrangement 50 for determining the instant $t_o$ at which the leading edge of a high-frequency pulse starts comprises a delay circuit 51 for delaying the received pulse by a time equal to k/2F (where k is an integer) and for thus producing a second pulse $V_R$ of the form:

$$V_R = A\left(t - t_o - \frac{k}{2F}\right) \cdot \sin\left[2\pi F\left(t - \frac{k}{2F}\right)\right] \quad (2)$$

and a calculating circuit 52 for calculating the instant $t_o$ by means of the calculation:

$$t_o = t - \frac{k(-1)^k}{2F[(-1)^k V - V_R]} \quad (3)$$

To prove the equation (3) it should be noted that:

$$\sin\left[2\pi F\left(t - \frac{k}{2F}\right)\right] = (-1)^k \sin 2\pi Ft$$

and that the relation (1) gives:

$$\sin 2\pi Ft = \frac{V}{A \cdot (t - t_o)}$$

Preferably, k=2 is opted for, so that (3) is then written as:

$$t_o = t - \frac{V}{F(V - V_R)} \quad (4)$$

Figure 4:
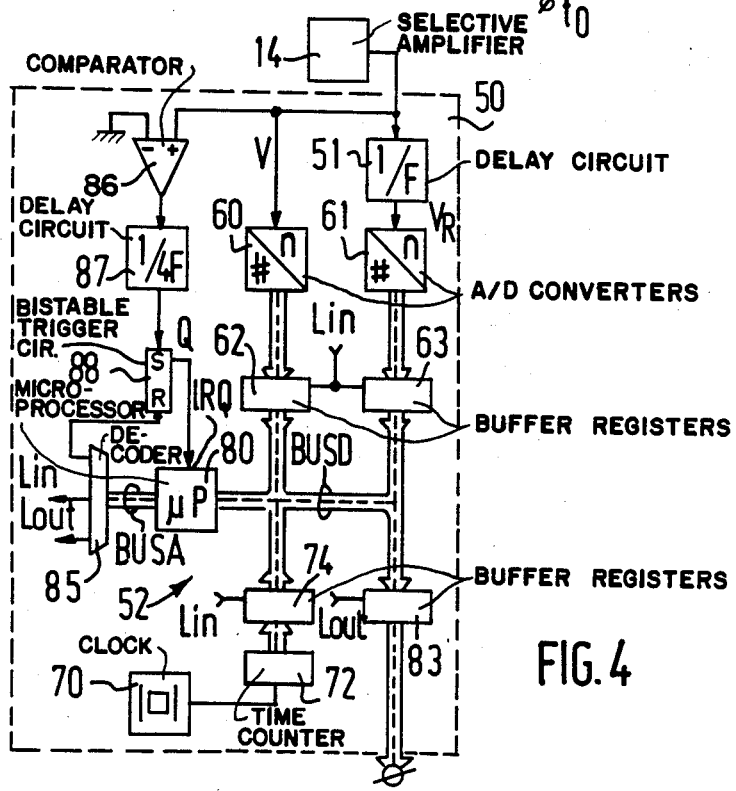
FIG. 4 shows a first embodiment of an arrangement according to the invention.

FIG. 4 shows an embodiment of the arrangement 50 in accordance with the invention. This embodiment comprises two analog-to-digital converters 60 and 61 for converting the signals V and $V_R$, respectively, at the output of the delay circuit 51. The digital outputs of these converters 60 and 61 are connected to buffer registers 62 and 63. A clock 70 continuously applies incrementation signals to a time counter 72 which thus gives an indication of the time "t". The parallel outputs of the counter 70 are also connected to a buffer register 74. The registers 62, 63, and 74 comprising load control means connected to a wire $L_{in}$ serve as an interface for the calculation circuit 52, which is constituted by a microprocessor calculating assembly 80. The parallel outputs of the registers 62, 63, and 74 are connected to the line BUSD of the microprocessor 80. A buffer register 83 whose parallel inputs are also connected to the line BUSD has for its object to store the value $t_o$ to be determined. The microprocessor also comprises a line BUSA for conveying the address codes; thus, each register 62, 63, 74 can be selected to be read in a manner not shown; however, a specific code has been assigned so as to ensure that the load commands (wire $L_{in}$) of the registers 62, 63 and 74 are energized simultaneously. This is accomplished by means of a decoder 85. Another code transmitted through a wire $L_{out}$ allows loading of the register 83. To trigger the calculated operation indicated by formula (4), a signal appearing at the input IRQ of the microprocessor 80 is awaited. This signal is produced by a comparator 86 which is followed by a second delay circuit producing a delay of ¼ F, denoted by reference numeral 87; this comparator uses an active signal from the moment voltage V passes through zero. The delay circuit 87 ensures that the signals V and $V_R$ have an amplitude near the maximum level when the signal is applied to the input S of a bistable trigger circuit 88 of the RS type. The signal at the output Q of this trigger circuit 88 is applied to the input IRQ of the microprocessor 80. On receipt of this signal, the interrupt program is perfomed. The registers 62, 63 and 74 are loaded simultaneously and the calculating operation defined by formula (4) is performed; the result is thereafter loaded into the register 83. It will be obvious that several calculations can be executed. To that end, the registers 62, 63 and 74 are loaded several times and the value which is ultimately stored in the register 83 is the mean value of all these calculations. The interrupt program can then by started by read sequences of the registers 62, 63 and 74 and the calculation will only be effected for the highest values contained in the registers 62 and 63. At the end of the calculating operations, an address code is generated which, decoded by the decoder 85, causes a reset-to-zero signal to appear at the input R of the bistable trigger circuit 88.

FIG. 5 shows a further embodiment, components corresponding to those shown in the preceding Figures having been given the same reference numerals. This embodiment comprises a single analog-to-digital converter 90. The clock 70 also applies incrementation signals to the time counter 72. The data at the output of the converter 90 and at the output of the counter 72 are stored in a memory 95 of the first-in, first-out type (FIFO memory). Storing these data is effected at the rate of the output signal of an AND-gate 96, which receives a clock signal at the first of its inputs and the output signal Q of a RS-type bistable trigger circuit 97 at its other input. This bistable trigger circuit 97 is set to the "1" or "0" state under the control of the microprocessor 80 for which purpose two different code addresses are used. These codes are transmitted via the bus BUSA to an address decoder 98 which via two wires SW and RR, supplies the codes for setting the bistable triggering circuit to the "1" state and the "0" state, respectively.

In this example, the frequency of the clock 70 is chosen such that after dividing the frequency it is possible to obtain a frequency which is a multiple (for example 10 times) of the frequency F (that of the intermediate frequency). This is the signal having a period 1/10F, which is applied to the first input of the gate 96. The output signal of a comparator 99 is used to trigger the microprocessor; this signal, which is applied to the input IRQ of the microprocessor, is not produced until the signal at the (+) input of the comparator connected to the output of the amplifier 14 exceeds a threshold value $V_S$ at the (−) input.

From the moment an active signal is applied to the input IRQ, the processing operation starts by storing in the memory 95 the data at the output of the analog-to-digital converter 90 and of the time counter 72; to that end the bistable triggering circuit 97 is set to the "1" state to enable this recording operation at the rate of the clock 70. After this write phase, the data stored in this memory 95 are processed. An active signal then appears on the wire RR, which sets the bistable triggering circuit 97 to the "0" state, thus blocking the gate 96 and making the first stored data available at the output of the memory 95. The operation defined by the formula (4) is then effected in accordance with the above-specified criteria and the value found is loaded in the register 83. Although the data are spaced in time by 1/10 F, the calculations are effected for the pairs of values spaced by 1/F.

The embodiment shown in FIG. 6 allows analog-to-digital conversions at a rate which is much slower than in the embodiment shown in FIG. 5. For that purpose, it comprises two converters 90' and 90"; the former is connected directly to the output of the amplifier 14, the latter to the output of a delay circuit 100, which produces a time delay of the order of ¼F. The input of this circuit is also connected to the output of the amplifier 14. A comparator 101 is connected to the input of the circuit 100. The data at the outputs of the converters 90' and 90" and at the output of the counter 72 are stored by means of active signals at the output of the gate 96. Although the assembly is similar to that of FIG. 5, the rate of the signals is here 1/F. The microprocessor is triggered from the moment the voltage at the input of the circuit 100 exceeds the value $V_S$. This operation starts by storing different data during 300 ns in the memory 95', which has a much smaller capacity than the memory 95. Thereafter the sequence of values supplied by one of the converters 90' and 90" is selected, namely the one which produces the highest values, and the calculation is then effected. This calculation must of course take the delay ¼F produced by the circuit 100 into account, provided it is the opted for sequence supplied by the converter 90".

Within the scope of the invention, it is possible to use different delays of k/F such as are produced by the circuit 51. In that case a second delay circuit must be provided. Thus, in FIG. 7, two delay circuits 51' and 51" are shown which produce respective different delays $\alpha$ and $\beta$. The output signals of these circuits 51' and 51" are designated $V_\alpha$ and $V_\beta$, respectively, the input signal is denoted by V; then it is written that:

$$V = A.(t-t_o).\sin 2\pi Ft \quad (5)$$

$$V_\alpha = A.(t-t_o-\alpha).\sin 2\pi F(t-\alpha) \quad (6)$$

$$V_\beta = A.(t-t_o-\beta).\sin 2\pi F(t-\beta) \quad (7)$$

In that case the calculating circuit 52' must perform the operation:

$$t_o = \quad (8)$$

$$t - V \frac{\cos 2\pi F\beta \cdot \sin 2\pi F\alpha \cdot \beta - \cos 2\pi F\alpha \cdot \sin 2\pi F\beta \cdot \alpha}{V_\alpha \sin 2\pi F\beta - V_\beta \sin 2\pi F\alpha - V \sin 2\pi F(\beta - \alpha)}$$

What is claimed is:

1. An arrangement for determining the starting instant $t_o$ of the leading edge of a received high-frequency pulse signal V of the form $V = A.(t-t_o).\sin 2\pi Ft$, where V is the instantaneous voltage, A is the slope of the leading edge, t is the time ($t > t_o$), and F is the frequency,
   said arrangement comprising:
   (a) receiving means for receiving the pulse signal V;
   (b) delay means electrically connected to the receiving means for delaying the received pulse signal V by a time equal to k/2F (where k is an integer) and thereby producing a second pulse signal $V_R$ of the form $V_R = A.(t-t_o-k/2F).\sin 2\pi$; and
   (c) processing means electrically-connected to the receiving means and to the delay means for determining $t_o$ from the signals V and $V_R$ by performing the calculation $$t - \frac{k(-1)^k V}{2F[(-1)^k V - V_R]}$$

and for producing a signal representative of $t_o$.

2. An arrangement as in claim 1 wherein k=2.

3. An arrangement as in claim 1 or 2, where the delay means comprises a delay circuit.

4. An arrangement as in claim 1 or 2, comprising a threshold circuit for triggering the processing means from the moment the amplitude of the receiving pulse signal V attains a predetermined magnitude.

5. An arrangement as in claim 1 or 2 where the processing means includes sampling means for sampling the pulse signals at a rate which is high relative to the frequency F.

6. An arrangement as in claim 1 or 2 where the processing means includes sampling means for sampling the pulse signals at a rate which is on the order of magnitude of the frequency F.

7. An arrangement for determining the starting instant $t_o$ of the leading edge of a received high-frequency pulse signal V of the form $V = A.(t-t_o).\sin 2\pi Ft$, where V is the instantaneous voltage, A is the slope of the leading edge, t is the time ($t > t_o$), and F is the frequency,
   said arrangement comprising:
   (a) receiving means for receiving the pulse signal V;
   (b) first delay means electrically connected to the receiving means for delaying the received pulse signal V by a period of time equal to $\alpha$ and thereby producing a pulse signal $V_\alpha$ of the form $V_\alpha = A.(t-t_o-\alpha).\sin 2\pi F(t-\alpha)$;
   (c) second delay means electrically connected to the receiving means for delaying the received signal V by a period of time equal to $\beta$ and thereby producing a pulse signal $V_\beta$ of the form: $V_\beta = A.(t-t_o-\beta).\sin 2\pi F(t-\beta)$; and
   (d) processing means electrically connected to the receiving means and to the first and second delay means for determining $t_o$ from the signals V, $V_\alpha$ and $V_\beta$ by performing the calculation $$t - V \frac{\cos 2\pi F\beta \cdot \sin 2\pi F\alpha \cdot \beta - \cos 2\pi F\alpha \cdot \sin 2\pi F\beta \cdot \alpha}{V_\alpha \sin 2\pi F\beta - V_\beta \sin 2\pi F\alpha - V \sin 2\pi F(\beta - \alpha)}$$

and for producing a signal representative of $t_o$.

* * * * *